United States Patent
Shi et al.

(10) Patent No.: US 10,453,414 B2
(45) Date of Patent: Oct. 22, 2019

(54) GOA CIRCUIT AND LCD DEVICE

(71) Applicant: Shenzhen China Star Optoelectronics Semiconductor Display Technology Co., Ltd., Shenzhen, Guangdong (CN)

(72) Inventors: Longqiang Shi, Guangdong (CN); Shu Jhih Chen, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 105 days.

(21) Appl. No.: 15/739,783

(22) PCT Filed: Oct. 24, 2017

(86) PCT No.: PCT/CN2017/107543
§ 371 (c)(1),
(2) Date: Dec. 26, 2017

(87) PCT Pub. No.: WO2019/033549
PCT Pub. Date: Feb. 21, 2019

(65) Prior Publication Data
US 2019/0057664 A1    Feb. 21, 2019

(30) Foreign Application Priority Data
Aug. 16, 2017 (CN) .......................... 2017 1 0702450

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0408* (2013.01);
(Continued)

(58) Field of Classification Search
CPC ......... G09G 3/3677; G09G 2300/0408; G09G 2310/0286; G09G 2310/06;
(Continued)

(56) References Cited

U.S. PATENT DOCUMENTS

| 6,307,412 | B1* | 10/2001 | Kim ........................ G11C 7/22 |
| | | | 327/165 |
| 2015/0016584 | A1* | 1/2015 | Dun ........................ G11C 27/04 |
| | | | 377/68 |

(Continued)

FOREIGN PATENT DOCUMENTS

| CN | 104851403 A * | 8/2015 | ........... G11C 19/287 |
| CN | 105632441 A | 6/2016 | |

(Continued)

OTHER PUBLICATIONS

CN_2017107024509—ist OA.

*Primary Examiner* — Mark Edwards
(74) *Attorney, Agent, or Firm* — Andrew C. Cheng

(57) ABSTRACT

A GOA driving circuit includes a plurality of cascaded GOA units and outputs a gate driving signal to an Nth-stage horizontal scanning line of a display region by an Nth-stage GOA unit. The Nth-stage GOA unit includes a pull-up unit, a pull-up control unit, a pull-down unit, a pull-down sustaining unit, a download unit, and a bootstrap capacitor unit. The pull-up unit, the pull-down unit, the pull-down sustaining unit, and the bootstrap capacitor unit are respectively electrically connected with a first node and an Nth-stage horizontal scanning line. The pull-up control unit and the download unit are electrically connected with the first node. N is a positive integer. The Nth-stage GOA unit further includes a forced pull-down unit, which is used to force the first node to low level when clock signals are disappeared. A LCD device is also provided.

14 Claims, 7 Drawing Sheets

(52) U.S. Cl.
CPC . *G09G 2310/0286* (2013.01); *G09G 2310/06* (2013.01); *G09G 2310/061* (2013.01); *G09G 2310/08* (2013.01); *G09G 2330/04* (2013.01); *G09G 2330/06* (2013.01)

(58) Field of Classification Search
CPC ......... G09G 2310/061; G09G 2310/08; G09G 2330/04; G09G 2330/06; G11C 19/28
See application file for complete search history.

(56) References Cited

U.S. PATENT DOCUMENTS

| | | | |
|---|---|---|---|
| 2015/0380107 A1* | 12/2015 | Chen | G09G 3/3677 345/100 |
| 2016/0247476 A1* | 8/2016 | Xiao | G09G 3/3677 |
| 2017/0270879 A1* | 9/2017 | Han | G09G 3/3648 |
| 2018/0152189 A1* | 5/2018 | Papadopoulos | H01L 27/1225 |

FOREIGN PATENT DOCUMENTS

| | | |
|---|---|---|
| CN | 105913822 A | 8/2016 |
| CN | 106057152 A | 10/2016 |
| CN | 106057157 A | 10/2016 |
| CN | 106328084 A | 1/2017 |
| TW | 201535975 A | 9/2015 |

* cited by examiner

GOA CIRCUIT AND LCD DEVICE

BACKGROUND OF THE INVENTION

This application claims the priority of an application No. 201710702450.9 filed on Aug. 16, 2017, entitled "GOA circuit and LCD device", the contents of which are hereby incorporated by reference.

FIELD OF INVENTION

The present invention relates to a liquid crystal display (LCD), and more particularly to a gate driver on array (GOA) circuit and a LCD device.

DESCRIPTION OF PRIOR ART

The liquid crystal display device has become a display device of mobile communication devices, PCs, TVs and the like due to its advantages of high display quality, low price and convenient portability. The conventional LCD device driving technology tends to adopt GOA technology, GOA technology can simplify the manufacturing process of flat display panel, eliminate the need of bonding process of horizontal scanning line, improve productivity, reduce product cost, and enhance the integration of the display panel for making the display panel more suitable for the production of narrow border or borderless display products, to meet the needs of modern people.

GOA technology (gate driver on array technology), the gate line scan driving signal circuit is fabricated on an array substrate by using an existing thin film transistor (TFT) LCD array process to realize a scan driving method of gate-by-gate. The conventional GOA circuit comprises a plurality of cascaded GOA units. FIG. 1 is a circuit diagram of an Nth-stage GOA unit of a conventional art. FIG. 2 is a waveform diagram of each node or each output terminal of the conventional art. Referring to FIGS. 1-2, the Nth-stage GOA unit comprises a pull-up control unit 110, a pull-up unit 120, a pull-down unit 130, a pull-down sustaining unit 140, a download unit 150 and a bootstrap capacitor unit 160.

The pull-up unit 120 comprises a third transistor T3, and is mainly responsible for outputting a clock signal CK to an Nth-stage horizontal scanning line G(N) of the display region. The pull-up control unit 110 comprises a first transistor T1, and is responsible for controlling the turn-on time of the pull-up unit 120. A previous-stage download signal ST(N−1) or a start signal STV is inputted to a gate electrode and a source electrode of the first transistor T1 and a drain electrode of the first transistor T1 is connected with a first node Q (N). The pull-down unit 130 comprises transistors T4 and T5, and is responsible for pulling down the horizontal scanning signal on the Nth-stage horizontal scanning line G(N) to low level, that is, turning off the horizontal scanning signal. A next-stage download signal ST(N+1) is inputted to gate electrodes of the transistors T4 and T5. The pull-down sustaining unit 140 is responsible for maintaining the horizontal scanning signal on the Nth-stage horizontal scanning line G(N) and the first node Q(N) in the off state (i.e., the negative potential). The bootstrap capacitor unit 160 is responsible for the second rising of the potential of the first node Q(N), which facilitates the output of the pull-up unit 120. The download unit 150 is responsible for outputting a current-stage download signal ST(N). VSS indicates a DC low level.

In daily applications, the clock signal CK abruptly disappears in one period due to environmental influences such as signal interference. The disappearance of the clock signal CK causes no output signal ST(N+1) of a next-stage GOA unit. Because the function of a normal high potential of the output signal ST(N+1) of the next-stage GOA unit is to pull down the high potential of the first node Q(N) of the current-stage GOA unit, when the download signal ST(N+1) is not outputted, the high potential of the current-stage first node Q(N) will be maintained. Please refer to FIG. 3, which may result in high current and the LCD device may be damaged.

SUMMARY OF THE INVENTION

The technical problem to be solved in the embodiments of the present invention is to provide a gate driver on array (GOA) circuit and a liquid crystal display (LCD) device. When the clock signal fails, the potential of the first node can be pulled down, so as to prevent the LCD device from being damaged.

In order to solve the technical problem, the first embodiment of the present invention provides a GOA circuit. The GOA driving circuit comprises a plurality of cascaded GOA units and outputs a gate driving signal to an Nth-stage horizontal scanning line of a display region by an Nth-stage GOA unit. The Nth-stage GOA unit comprises a pull-up unit, a pull-up control unit, a pull-down unit, a pull-down sustaining unit, a download unit, and a bootstrap capacitor unit. The pull-up unit, the pull-down unit, the pull-down sustaining unit, and the bootstrap capacitor unit are respectively electrically connected with a first node and an Nth-stage horizontal scanning line. The pull-up control unit and the download unit are electrically connected with the first node. N is a positive integer. The Nth-stage GOA unit further comprises:

A forced pull-down unit is used to force the first node to low level when clock signals are disappeared.

The forced pull-down unit comprises a twelfth thin film transistor (TFT). A gate electrode of the twelfth TFT is connected with a reset signal, a source electrode of the twelfth TFT is electrically connected with the first node, and a drain electrode of the twelfth TFT is connected with a first low level. The reset signal changes from low level to high level when the clock signals are disappeared.

The pull-down sustaining unit comprises a sixth TFT, a seventh TFT, an eighth TFT, a ninth TFT, a tenth TFT, and an eleventh TFT. A source electrode of the sixth TFT is connected with the first node, a drain electrode of the sixth TFT is connected with a first low level, and a gate electrode of the sixth TFT is electrically connected with an Nth-stage second node. A source electrode of the seventh TFT is electrically connected with the Nth-stage horizontal scanning line, and a drain electrode of the seventh TFT is connected with the first low level, and a gate electrode of the seventh TFT is electrically connected with the Nth-stage second node. A gate electrode and a source electrode of the eighth TFT are electrically connected with a high level, and a drain electrode of the eighth TFT is electrically connected with a gate electrode of the ninth TFT and a source electrode of the eleventh TFT. A source electrode of the ninth TFT is electrically connected with the high level and a drain electrode of the ninth TFT is electrically connected with the Nth-stage second node. A source electrode of the tenth TFT is electrically connected with the Nth-stage second node, a drain electrode of the ten TFT is connected with the first low level, and a gate electrode of the tenth TFT is electrically connected with the first node. A drain electrode of the eleventh TFT is electrically connected with the first low level and a gate electrode of the eleventh TFT is electrically connected with the first node.

The forced pull-down unit comprises a thirteenth TFT. A gate electrode of the thirteenth TFT is connected with a reset signal, a source electrode of the thirteenth TFT is electrically connected with a high level, and a drain electrode of the thirteenth TFT is electrically connected with an Nth-stage second node. The reset signal changes from low level to high level when the clock signals are disappeared.

The clock signals comprise a first clock signal and a second clock signal. The first clock signal and the second clock signal have the same frequency, and in one cycle, phases of the first clock signal and the second clock signal except the blanking interval are opposite in phase. The forced pull-down unit comprises an eighteenth TFT, a nineteenth TFT, a twentieth TFT, and a twenty-first TFT. A source electrode and a gate electrode of the eighteenth TFT are electrically connected with the high level; a drain electrode of the eighteenth TFT is electrically connected with a gate electrode of the nineteenth TFT, a source electrode of the twentieth TFT and a source electrode of the twenty-first TFT respectively. A source electrode of the nineteenth TFT is electrically connected with the high level and a drain electrode of the nineteenth TFT is connected with the Nth-stage second node. A gate electrode of the twentieth TFT is electrically connected with the first clock signal and a drain electrode of the twentieth TFT is electrically connected with the first low level. A gate electrode of the twenty-first TFT is electrically connected with the second clock signal and a drain electrode of the twenty-first TFT is electrically connected with the first low level.

The clock signals comprise a first clock signal and a second clock signal. The first clock signal and the second clock signal have the same frequency, and in one cycle, phases of the first clock signal and the second clock signal except the blanking interval are opposite in phase. The forced pull-down unit comprises an fourteenth TFT, a fifteenth TFT, a sixteenth TFT, and a seventeenth TFT. A source electrode and a gate electrode of the fourteenth TFT are electrically connected with the high level; a drain electrode of the fourteenth TFT is electrically connected with a gate electrode of the fifteenth TFT, a source electrode of the sixteenth TFT, and a source electrode of the seventeenth TFT respectively. A source electrode of the fifteenth TFT is electrically connected with the first node; a drain electrode of the fifteenth TFT is connected with the first low level. A gate electrode of the sixteenth TFT is electrically connected with the first clock signal and a drain electrode of the sixteenth TFT is electrically connected with the first low level. A gate electrode of the seventeenth TFT is electrically connected with the second clock signal and a drain electrode of the seventeenth TFT is electrically connected with the first low level.

One cycle of the GOA driving circuit comprises a blanking interval. The forced pull-down unit forces the first node to low level when the clock signals are disappeared except the blanking interval of the cycle of the GOA driving circuit.

The pull-up unit comprises a third TFT. A source electrode of the third TFT is connected with a first clock signal, a gate electrode of the third TFT is electrically connected with the first node, and a drain electrode of the third TFT is electrically connected with the Nth-stage horizontal scanning line.

The pull-down unit comprises a fourth TFT and a fifth TFT. A source electrode of the fourth TFT is electrically connected with the first node and a drain electrode of the fourth TFT is connected with a first low level. A source electrode of the fifth TFT is electrically connected with the Nth-stage horizontal scanning line and a drain electrode of the fifth TFT is connected with the first low level. A gate electrode of the fourth TFT and a gate electrode of the fifth TFT are both connected with a (N+1)-stage download signal.

The second embodiment of the present invention provides a LCD device, which comprises the above GOA driving circuit.

Implementing the embodiment of the present invention has below advantages:

Since the GOA unit comprises a forced pull-down unit for forcing the first node to low level when the clock signals are disappeared, the forced pull-down unit forces the first node to low level when clock signals struptly disappears in one cycle due to signal interference, so as not to cause a large current and the LCD device will not be damaged.

BRIEF DESCRIPTION OF THE DRAWINGS

In order to describe the technical solutions in the embodiments of the present invention or in the conventional art more clearly, the accompanying drawings required for describing the embodiments or the conventional art are briefly introduced. Apparently, the accompanying drawings in the following description only show some embodiments of the present invention. For those skilled in the art, other drawings may be obtained based on these drawings without any creative work.

DETAILED DESCRIPTION OF THE PREFERRED EMBODIMENTS

The technical solutions in the embodiments of the present invention are clearly and completely described below with reference to the accompanying drawings in the embodiments of the present invention. Obviously, the described embodiments are only some embodiments of the present invention, rather than all of the embodiments. All other embodiments obtained by persons of ordinary skill in the art based on the embodiments of the present invention without creative efforts shall fall within the protection scope of the present invention.

The terms "comprising" and "having," as well as any variations thereof, appearing in the specification, claims and drawings, are intended to cover the inclusion of non-exclusive. For example, a process, method, system, product, or device that incorporates a series of steps or units is not limited to the steps or units listed but may optionally further include steps or units not listed or may optionally further include other steps or units inherent to these processes, methods, products or devices. In addition, the terms "first", "second" and "third" are used to distinguish different objects and are not intended to describe a specific order.

First Embodiment

The first embodiment of the present invention provides a GOA circuit. The GOA driving circuit comprises a plurality of cascaded GOA units. For example, the GOA units comprise M-stage GOA units, a second-stage GOA unit is electrically connected with a first-stage GOA unit, a third-stage GOA unit is electrically connected with a second-stage GOA unit, . . . , a Mth-stage GOA unit is electrically connected with a (M−1)th-stage GOA unit. Each GOA unit outputs a gate driving signal to a corresponding horizontal scanning line of a display region. For example, the first-stage GOA unit outputs a gate driving signal to the first-stage horizontal scanning line G(1), the second-stage GOA unit outputs a gate driving signal to a second-stage horizontal scanning line G(2), the third-stage GOA unit outputs a gate driving signal to a third-stage horizontal scanning line G(3), . . . , and the Mth-stage GOA unit outputs a gate driving signal to a Mth-stage horizontal scanning line G (M). After a time period, once again, the GOA driving circuit orderly outputs the gate driving signals to the first-stage horizontal scanning line G(1), the second-stage horizontal scanning line G(2), the third-stage horizontal scanning line G(3), . . . , and Mth-stage horizontal scanning line G (M). In other words, the GOA driving circuit outputs the gate driving signals according to a cycle. One cycle of the GOA driving circuit comprises a blanking interval which is between a time after the Mth-stage GOA unit outputs the gate driving signal to the Mth-stage horizontal scanning line G(M) and the start of the next cycle. The blanking interval comprises a synchronization leading edge time, a synchronization time and a synchronization trailing edge time. Where M is a positive integer.

Figure 1:
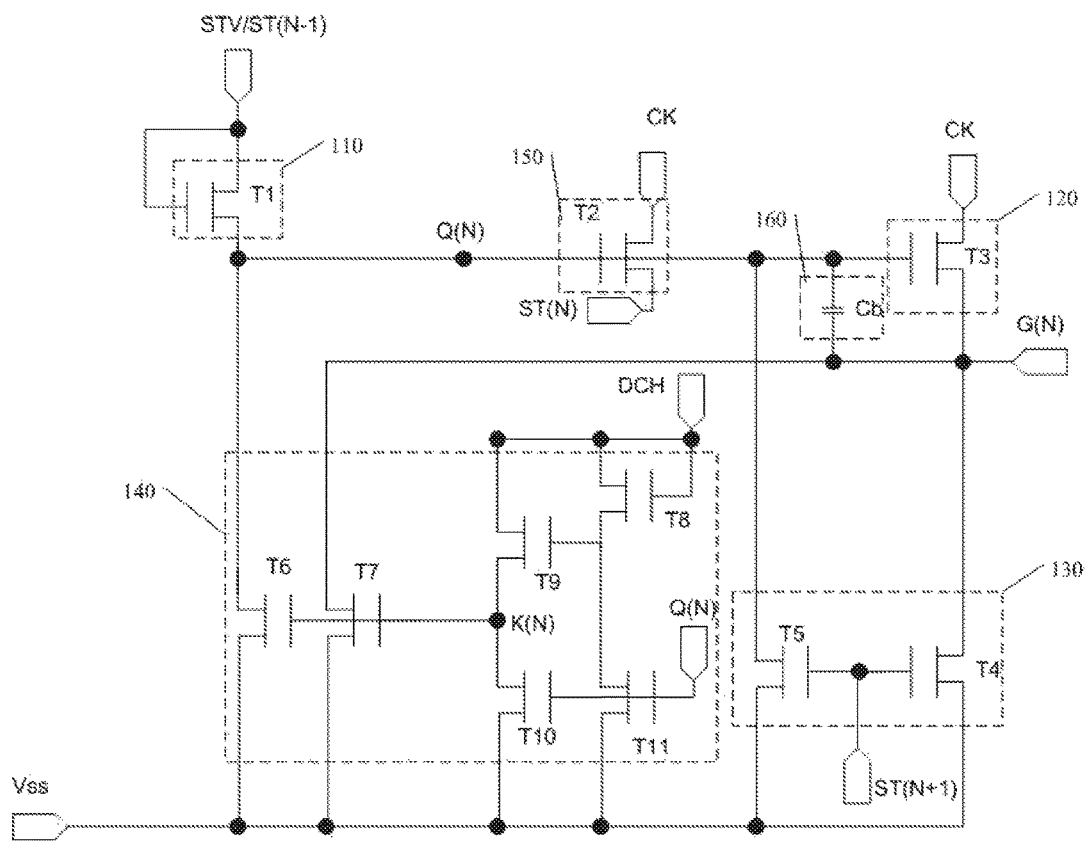
FIG. 1 is a circuit diagram of an Nth-stage GOA circuit according to the conventional art.
Figure 2:
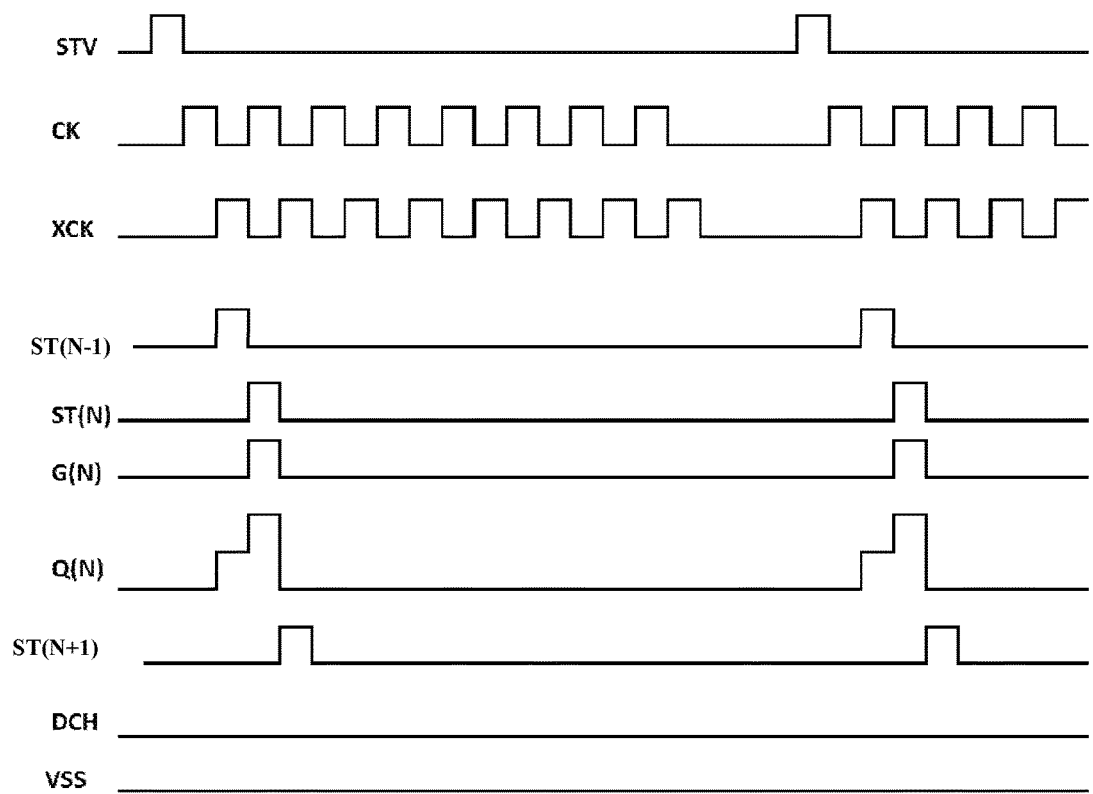
FIG. 2 is a time-domain diagram of signals of an Nth-stage GOA circuit according to the conventional art.
Figure 3:
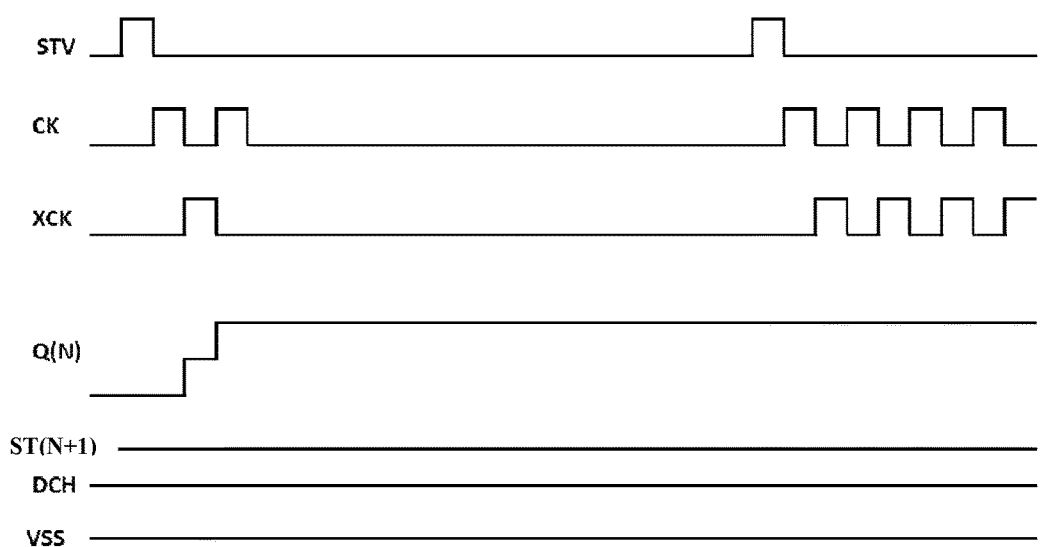
FIG. 3 is a time-domain diagram of signals of an Nth-stage GOA circuit according to the conventional art when the clock signal is failed.
Figure 4:
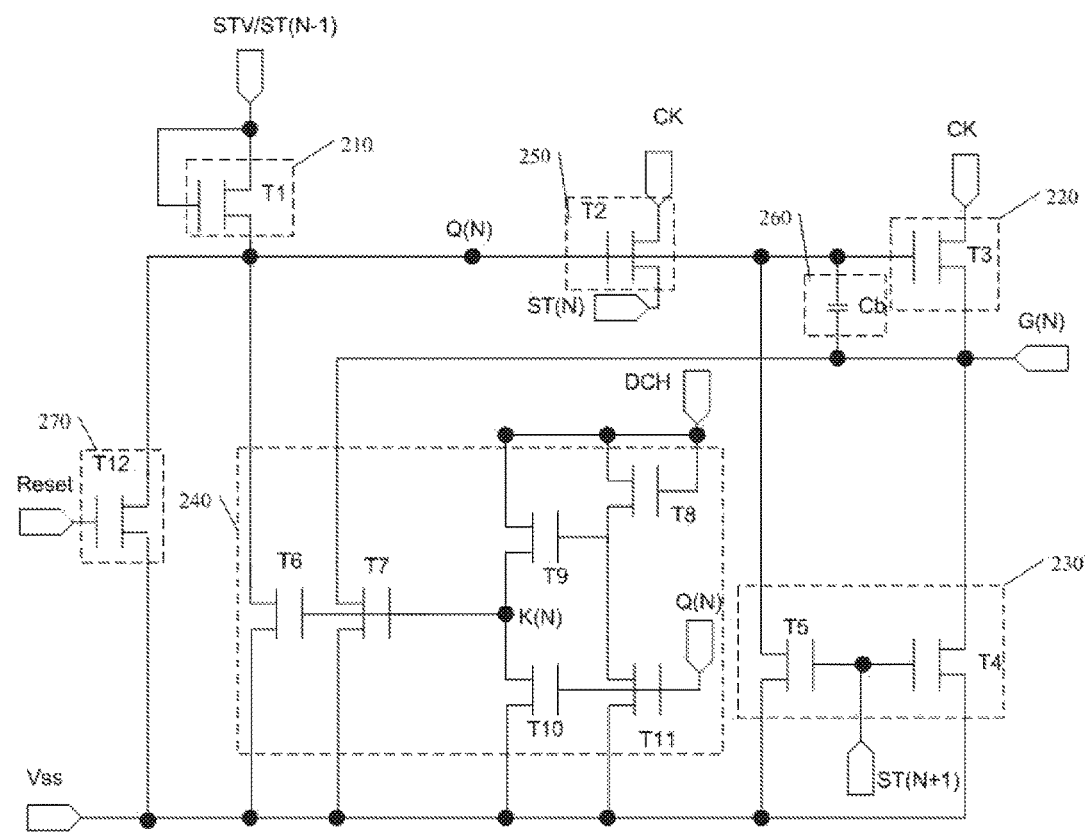
FIG. 4 is a circuit diagram of an Nth-stage GOA circuit of a first embodiment according to the present invention.
Figure 5:
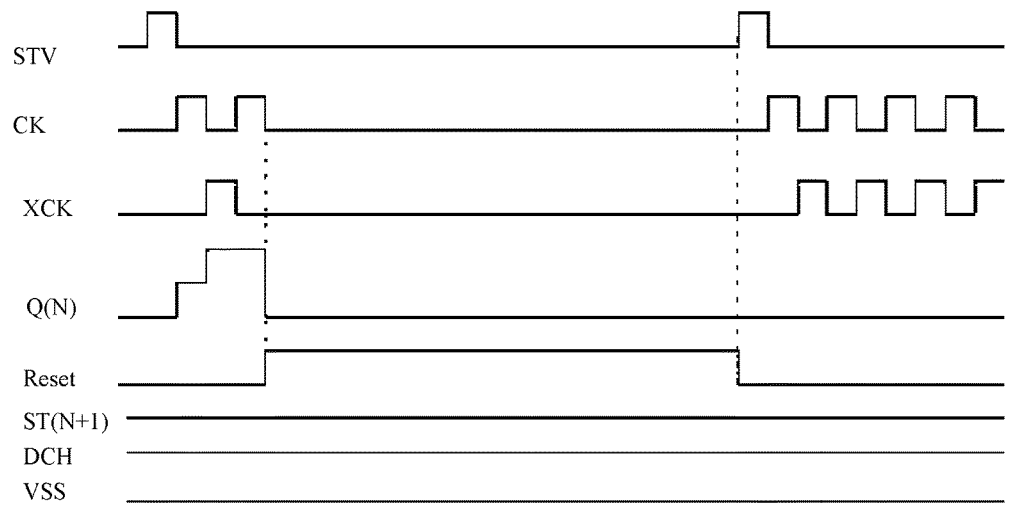
FIG. 5 is a time-domain diagram of signals of an Nth-stage GOA circuit of a first embodiment according to the present invention when the clock signal is failed.

Please refer to FIGS. 4-5, in the embodiment, the Nth-stage GOA unit comprises a pull-up control unit 210, a pull-up unit 220, a pull-down unit 230, a pull-down sustaining unit 240, a download unit 250, and a bootstrap capacitor unit 260. N is a positive integer and N is less than or equal to M. The pull-up unit 220, the pull-down unit 230, the pull-down sustaining unit 240, and the bootstrap capacitor unit 260 are respectively electrically connected with a first node Q(N) and an Nth-stage horizontal scanning line G(N). The pull-up control unit 210 and the download unit 250 are electrically connected with the first node Q(N).

In the embodiment, the GOA unit further comprises a forced pull-down unit 270, which is used to force the first node Q(N) to low level when clock signals are disappeared. Specifically, the forced pull-down unit 270 forces the first node Q(N) to low level when the clock signals are disappeared except the blanking interval of the cycle of the GOA driving circuit. The first node Q(N) may be a first node Q(N) of the Nth-stage GOA driving unit or a common first node Q(N) to the GOA driving circuit. Therefore, the forced pull-down unit 270 will force the first node Q(N) to low level when the clock signal suddenly disappears in a cycle due to signal interference. See FIG. 5, so that no large current will be caused, the LCD device will not be damaged, also.

Please further refer to FIG. 4; the forced pull-down unit 270 comprises a twelfth thin film transistor (TFT) T12. A gate electrode of the twelfth TFT T12 is connected with a reset signal Reset, a source electrode of the twelfth TFT T12 is electrically connected with the first node Q(N), and a drain electrode of the twelfth TFT T12 is connected with a first low level Vss. The first low level Vss is a low-level direct-current power supply with a potential of −7V. The reset signal Reset changes from low level to high level when the clock signals are disappeared. In the embodiment, the clock signals comprise a first clock signal CK1 and a second clock signal XCK. The first clock signal CK1 and the second clock signal XCK have the same frequency, and in one cycle, phases of the first clock signal CK1 and the second clock signal XCK except the blanking interval are opposite in phase, and both the first clock signal CK and the second clock signal XCK are at low level during the blanking interval, and the first clock signal CK and the second clock signal XCK are disappeared at the same time. When the clock signal suddenly disappears in one cycle due to signal interference, the reset signal Reset is triggered to go from low level to high level, so that the twelfth TFT T12 is turned on, the first node Q(N) is pulled down to the first low level Vss, see the waveform diagram of FIG. 5, so that no large current will be caused and the LCD device will not be damaged. The reset signal Reset will become low level again at the beginning of the next cycle, that is, the reset signal Reset will become low level again when receiving that the start signal STV is changed to high level.

In the embodiment, the pull-down sustaining unit 240 comprises a sixth TFT T6 and a seventh TFT T7. A source electrode of the sixth TFT T6 is connected with the first node Q(N), a drain electrode of the sixth TFT T6 is connected with a first low level Vss, and a gate electrode of the sixth TFT T6 is electrically connected with a second node K(N). A source electrode of the seventh TFT T7 is electrically connected with the Nth-stage horizontal scanning line G(N), and a drain electrode of the seventh TFT T7 is connected with the first low level Vss, and a gate electrode of the seventh TFT T7 is electrically connected with the second node K(N). The pull-down sustaining unit 240 further comprises an eighth TFT T8, a ninth TFT T9, a tenth TFT T10, and an eleventh TFT T11. A gate electrode and a source electrode of the eighth TFT T8 are electrically connected with a first high level DCH, the first high level DCH is a high-level direct-current power supply, a potential of the first high level DCH is 28V, and a drain electrode of the eighth TFT T8 is electrically connected with a gate electrode of the ninth TFT T9 and a source electrode of the eleventh TFT T11. A source electrode of the ninth TFT T9 is electrically connected with the first high level DCH and a drain electrode of the ninth TFT T9 is electrically connected with the second node K(N). A source electrode of the tenth TFT T10 is electrically connected with the second node K(N), a drain electrode of the ten TFT T10 is connected with the first low level Vss, and a gate electrode of the tenth TFT T10 is electrically connected with the first node Q(N). A drain electrode of the eleventh TFT T11 is electrically connected with the first low level Vss and a gate electrode of the eleventh TFT T11 is electrically connected with the first node Q(N).

In the embodiment, the pull-up unit 220 comprises a third TFT T3. A source electrode of the third TFT T3 is connected with a first clock signal CK, a gate electrode of the third TFT T3 is electrically connected with the first node Q(N), and a drain electrode of the third TFT T3 is electrically connected with the Nth-stage horizontal scanning line G(N).

In the embodiment, the download unit 250 comprises a second TFT T2. A source electrode of the second TFT T2 is connected with the first clock signal CK, a gate electrode of the second TFT T2 is electrically connected with the first node Q (N), and a drain electrode of the second TFT T2 is used for outputting an Nth-stage download signal ST(N).

In the embodiment, the pull-down unit 230 comprises a fourth TFT T4 and a fifth TFT T5. A source electrode of the fourth TFT T4 is electrically connected with the first node Q(N) and a drain electrode of the fourth TFT T4 is connected with a first low level Vss. A source electrode of the fifth TFT T5 is electrically connected with the Nth-stage horizontal scanning line G(N) and a drain electrode of the fifth TFT T5 is connected with the first low level Vss. A gate electrode of the fourth TFT T4 and a gate electrode of the fifth TFT T5 are both connected with a (N+1)-stage download signal ST(N+1).

In the embodiment, the pull-up control unit 210 comprises a first TFT T1. A gate electrode and a source electrode of the first TFT T1 receive a (N−1)-stage download signal ST(N−1) or the start signal STV, and a drain electrode of the first TFT T1 is electrically connected with the first node Q(N).

In the embodiment, the bootstrap capacitor unit 260 comprises a capacitor Cb. One terminal of the capacitor Cb is electrically connected with the first node Q(N), and another terminal of the capacitor Cb is electrically connected with the Nth-stage horizontal scanning line G(N).

Additionally, the embodiment of the present invention further provides a liquid crystal display (LCD) device, which comprises the above GOA driving circuit.

Second Embodiment

Figure 6:
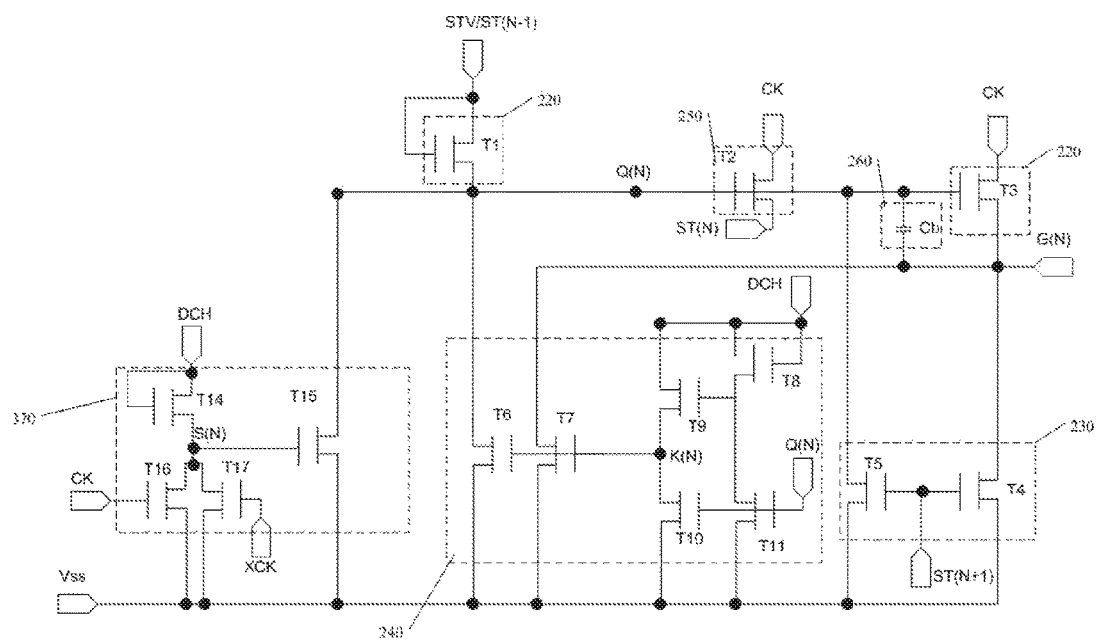
FIG. 6 is a circuit diagram of an Nth-stage GOA circuit of a second embodiment according to the present invention.

FIG. 6 is a circuit diagram of an Nth-stage GOA circuit of a second embodiment according to the present invention. The circuit of FIG. 6 is similar with the circuit of FIG. 4; therefore, the same reference numerals denote the same elements. The main difference between this embodiment and the first embodiment is the forced pull-down unit.

In the embodiment, the clock signals comprise a first clock signal CK1 and a second clock signal XCK. The first clock signal CK1 and the second clock signal XCK have the same frequency, and in one cycle, phases of the first clock signal CK1 and the second clock signal XCK except the blanking interval are opposite in phase, and both the first clock signal CK and the second clock signal XCK are at low level during the blanking interval.

Figure 7:
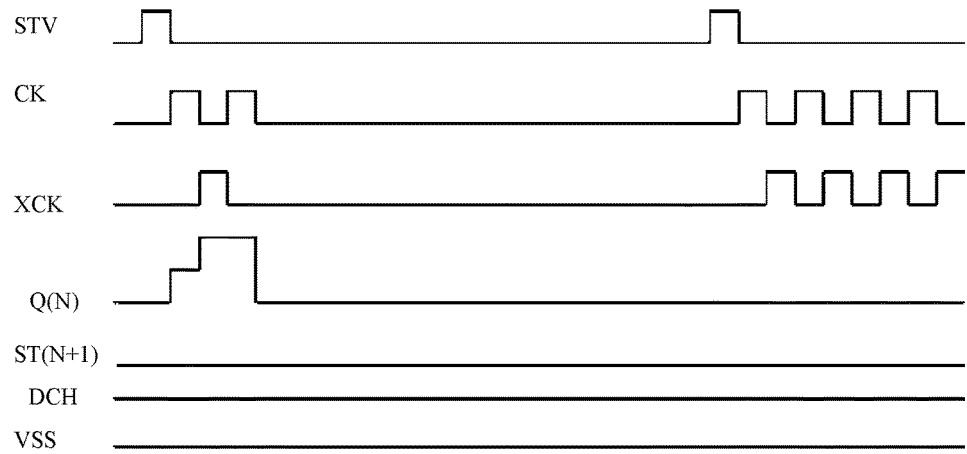
FIG. 7 is a time-domain diagram of signals of an Nth-stage GOA circuit of a second embodiment according to the present invention when the clock signal is failed.

Please refer to FIGS. 6-7, the forced pull-down unit 370 comprises an fourteenth TFT T14, a fifteenth TFT T15, a sixteenth TFT T16, and a seventeenth TFT T17. A source electrode and a gate electrode of the fourteenth TFT T14 are electrically connected with the first high level DCH; a drain electrode of the fourteenth TFT T14 is electrically connected with a gate electrode of the fifteenth TFT T15, a source electrode of the sixteenth TFT T16, and a source electrode of the seventeenth TFT T17 respectively. A source electrode of the fifteenth TFT T15 is electrically connected with the first node Q(N), a drain electrode of the fifteenth TFT T15 is connected with the first low level Vss. A gate electrode of the sixteenth TFT T16 is electrically connected with the first clock signal CK and a drain electrode of the sixteenth TFT T16 is electrically connected with the first low level Vss. A gate electrode of the seventeenth TFT T17 is electrically connected with the second clock signal XCK and a drain electrode of the seventeenth TFT T17 is electrically connected with the first low level Vss. When the clock signal is abruptly disappeared in one cycle due to signal interference.

In other words, when the first clock signal CK and the second clock signal XCK are suddenly disappeared, the sixteenth TFT T16 and the seventeenth TFT T17 are turned off at this time, the fourteenth TFT T14 is turned on, so that a third node S(N) is at high level, the fifteenth TFT T15 is turned on, the first node Q(N) is pulled low to the first low level Vss, see FIG. 7, this will not cause a large current, the LCD device will not be damaged.

Third Embodiment

Figure 8:
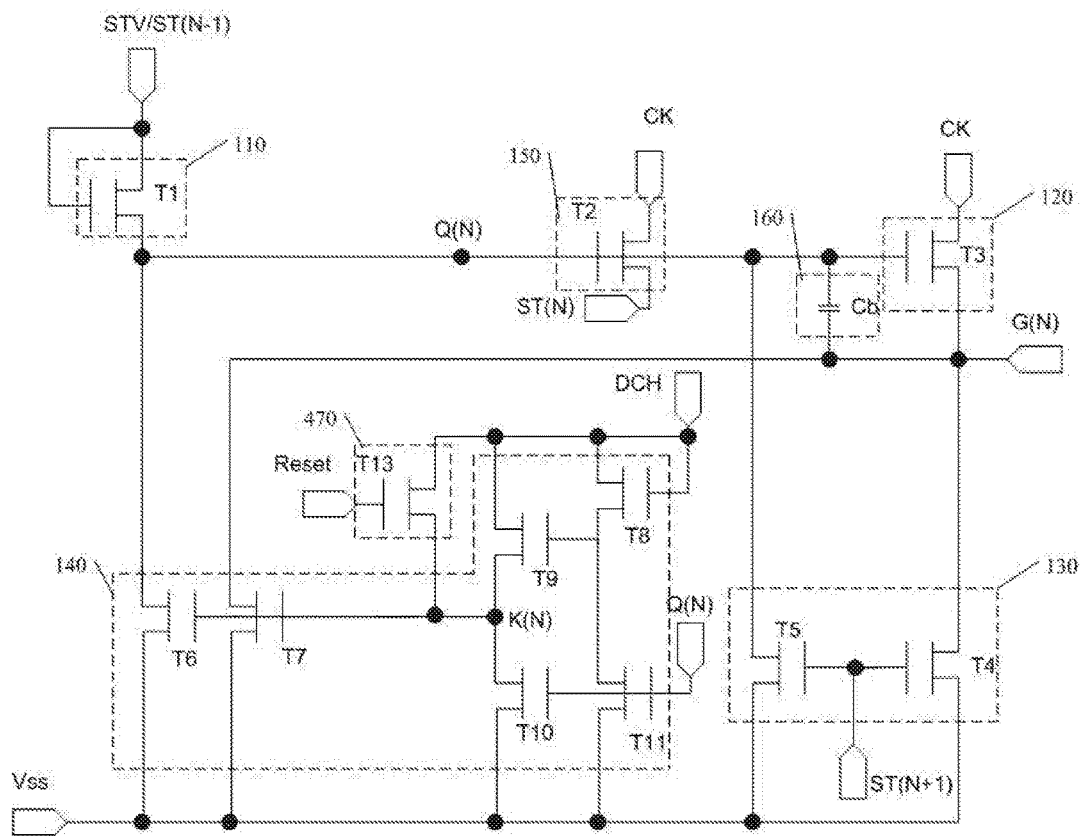
FIG. 8 is a circuit diagram of an Nth-stage GOA circuit of a third embodiment according to the present invention.

FIG. 8 is a circuit diagram of an Nth-stage GOA circuit of a third embodiment according to the present invention. The circuit of FIG. 8 is similar with the circuit of FIG. 4; therefore, the same reference numerals denote the same elements. The main difference between this embodiment and the first embodiment is the forced pull-down unit.

Please refer to FIG. 8; the forced pull-down unit 470 comprises a thirteenth TFT T13. A gate electrode of the thirteenth TFT T13 is connected with a reset signal Reset, a source electrode of the thirteenth TFT T13 is electrically connected with a first high level DCH, and a drain electrode of the thirteenth TFT T13 is electrically connected with an Nth-stage second node K(N). The reset signal Reset changes from low level to high level when the clock signals are disappeared. When the clock signal is suddenly disappeared in one cycle due to signal interference, the reset signal Reset is changed from low level to high level, so that the thirteenth TFT T13 is turned on. When the first node Q(N) is high level, the eighth TFT T8, the tenth TFT T10 and the eleventh TFT T11 are turned on, and the ninth TFT T9 is turned off. Since the thirteenth TFT T13 is turned on, the second node K(N) is pulled up to high level, the sixth TFT T6 is turned on, so that the first node Q(N) is pulled down to the first low level Vss. This will not cause a large current and the LCD device will not be damaged.

Fourth Embodiment

Figure 9:
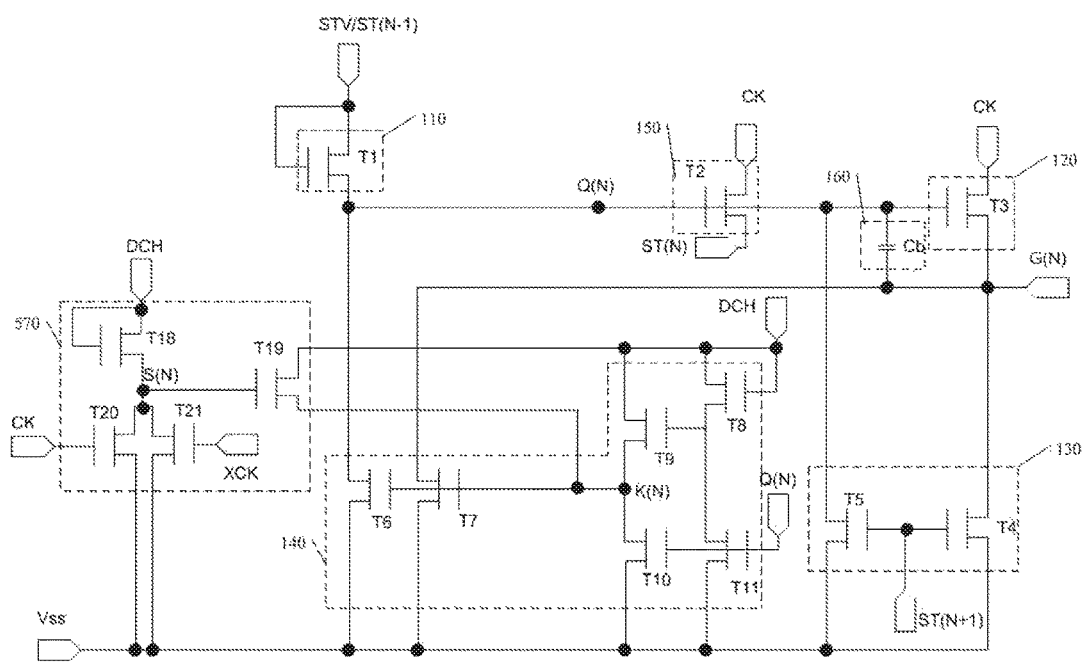
FIG. 9 is a circuit diagram of an Nth-stage GOA circuit of a fourth embodiment according to the present invention.

FIG. 9 is a circuit diagram of an Nth-stage GOA circuit of a fourth embodiment according to the present invention. The circuit of FIG. 9 is similar with the circuit of FIG. 8; therefore, the same reference numerals denote the same elements. The main difference between this embodiment and the third embodiment is the forced pull-down unit.

In the embodiment, the clock signals comprise a first clock signal CK1 and a second clock signal XCK. The first clock signal CK1 and the second clock signal XCK have the same frequency, and in one cycle, phases of the first clock signal CK1 and the second clock signal XCK except the blanking interval are opposite in phase, and both the first clock signal CK and the second clock signal XCK are at low level during the blanking interval.

Please refer to FIG. 9, the forced pull-down unit 570 comprises an eighteenth TFT T18, a nineteenth TFT T19, a twentieth TFT T20, and a twenty-first TFT T21. A source electrode and a gate electrode of the eighteenth TFT T18 are electrically connected with the first high level DCH, a drain electrode of the eighteenth TFT T18 is electrically connected with a gate electrode of the nineteenth TFT T19, a source electrode of the twentieth TFT T20 and a source electrode of the twenty-first TFT T21 respectively. A source electrode of the nineteenth TFT T19 is electrically connected with the first high level DCH and a drain electrode of the nineteenth TFT T19 is connected with the Nth-stage second node K(N). A gate electrode of the twentieth TFT T20 is electrically connected with the first clock signal CK and a drain electrode of the twentieth TFT T20 is electrically connected with the first low level Vss. A gate electrode of the twenty-first TFT T21 is electrically connected with the second clock signal XCK and a drain electrode of the twenty-first TFT T21 is electrically connected with the first low level Vss. When the clock signal is abruptly disappeared in one cycle due to signal interference. In other words, when the first clock signal CK and the second clock signal XCK are suddenly disappeared, the twentieth TFT T20 and the twenty-first TFT T21 are turned off at this time, the eighteenth TFT T18 is turned on, so that a third node S(N) is at high level, the nineteenth TFT T19 is turned on, the second node Q(N) is pulled high to high level. The sixth TFT T6 is turned on, the first node Q(N) is pulled down to the first low level Vss, this will not cause a large current, the LCD device will not be damaged.

It should be noted that, each embodiment in this specification is described in a progressive manner, and each embodiment focuses on differences from other embodiments. The same and similar parts among the embodiments can refer to each other. Since the apparatus embodiment is basically similar to the method embodiment, the description is relatively simple, and for the relevant part, reference may be made to the part of the method embodiment for illustration.

Through the description of the above embodiments, the present invention has the following advantages:

Since the GOA unit comprises a forced pull-down unit for forcing the first node to low level when the clock signals are disappeared, the forced pull-down unit forces the first node to low level when clock signals struptly disappears in one cycle due to signal interference, so as not to cause a large current and the LCD device will not be damaged.

The above disclosure is only the preferred embodiments of the present invention, and certainly cannot be used to limit the scope of the present invention. Therefore, equivalent changes made according to the claims of the present invention are still within the scope of the present invention.

What is claimed is:

1. A gate driver on array (GOA) driving circuit, wherein the GOA driving circuit comprises a plurality of cascaded GOA units and outputs a gate driving signal to an Nth-stage horizontal scanning line of a display region by an Nth-stage GOA unit, the Nth-stage GOA unit comprises a pull-up unit, a pull-up control unit, a pull-down unit, a pull-down sustaining unit, a download unit, and a bootstrap capacitor unit; the pull-up unit, the pull-down unit, the pull-down sustaining unit, and the bootstrap capacitor unit are respectively electrically connected with a first node and an Nth-stage horizontal scanning line, the pull-up control unit and the download unit are electrically connected with the first node, where N is a positive integer; the Nth-stage GOA unit further comprises:

a forced pull-down unit for forcing the first node to change from a first-node high level to a first-node low level when clock signals disappear;

wherein one cycle of the GOA driving circuit comprises a blanking interval and the clock signals each exhibit multiple successive pulses except the blanking interval of the cycle, wherein each of the multiple pulses of each of the clock signals occupies a period of time in which a voltage level is normally raised from a clock low level to a clock high level, and the clock signals disappear when the clock signals abnormally maintain at the low clock level in the period of time of at least one of the pulses, and the forced pull-down unit forces the first node to the first-node low level when the clock signals disappear except the blanking interval of the cycle.

2. The GOA driving circuit according to claim 1, wherein the forced pull-down unit comprises a twelfth thin film transistor (TFT), wherein a gate electrode of the twelfth TFT is connected with a reset signal, a source electrode of the twelfth TFT is electrically connected with the first node, a drain electrode of the twelfth TFT is connected with a first low level, the reset signal changes from a reset low level to a reset high level when the clock signals disappear.

3. The GOA driving circuit according to claim 1, wherein the pull-down sustaining unit comprises a sixth TFT, a seventh TFT, an eighth TFT, a ninth TFT, a tenth TFT, and an eleventh TFT, wherein a source electrode of the sixth TFT is connected with the first node, a drain electrode of the sixth TFT is connected with a first low level supplied from a low voltage source, and a gate electrode of the sixth TFT is electrically connected with an Nth-stage second node; a source electrode of the seventh TFT is electrically connected with the Nth-stage horizontal scanning line, a drain electrode of the seventh TFT is connected with the first low level, and a gate electrode of the seventh TFT is electrically connected with the Nth-stage second node; a gate electrode and a source electrode of the eighth TFT are electrically connected with a first high level supplied from a high voltage source, and a drain electrode of the eighth TFT is electrically connected with a gate electrode of the ninth TFT and a source electrode of the eleventh TFT; a source electrode of the ninth TFT is electrically connected with the first high level supplied from the high voltage source, and a drain electrode of the ninth TFT is electrically connected with the Nth-stage second node; a source electrode of the tenth TFT is electrically connected with the Nth-stage second node, a drain electrode of the ten TFT is connected with the first low level supplied from the low voltage source, and a gate electrode of the tenth TFT is electrically connected with the first node; a drain electrode of the eleventh TFT is electrically connected with the first low level supplied from the low voltage source, and a gate electrode of the eleventh TFT is electrically connected with the first node.

4. The GOA driving circuit according to claim 3, wherein the forced pull-down unit comprises a thirteenth TFT, a gate electrode of the thirteenth TFT is connected with a reset signal, a source electrode of the thirteenth TFT is electrically connected with the first high level supplied from the high voltage source, a drain electrode of the thirteenth TFT is electrically connected with an Nth-stage second node, the reset signal changes from a reset low level to a reset high level when the clock signals disappear.

5. The GOA driving circuit according to claim 3, wherein the clock signals comprise a first clock signal and a second clock signal, wherein the first clock signal and the second clock signal have a same frequency, and in one cycle, phases of the first clock signal and the second clock signal except the blanking interval are opposite in phase; the forced pull-down unit comprises an eighteenth TFT, a nineteenth TFT, a twentieth TFT, and a twenty-first TFT, wherein a source electrode and a gate electrode of the eighteenth TFT are electrically connected with the first high level supplied from the high voltage source, a drain electrode of the eighteenth TFT is electrically connected with a gate electrode of the nineteenth TFT, and a source electrode of the twentieth TFT, and a source electrode of the twenty-first TFT respectively; a source electrode of the nineteenth TFT is electrically connected with the first high level supplied from the high voltage source, and a drain electrode of the nineteenth TFT is connected with the Nth-stage second node; a gate electrode of the twentieth TFT is electrically connected with the first clock signal, a drain electrode of the twentieth TFT is electrically connected with the first low level supplied from the low voltage source; a gate electrode of the twenty-first TFT is electrically connected with the second clock signal, and a drain electrode of the twenty-first TFT is electrically connected with the first low level supplied from the low voltage source.

6. The GOA driving circuit according to claim 1, wherein the clock signals comprise a first clock signal and a second clock signal, the first clock signal and the second clock signal have a same frequency, and in one cycle, phases of the first clock signal and the second clock signal except the blanking interval are opposite in phase; the forced pull-down unit comprises an fourteenth TFT, a fifteenth TFT, a sixteenth TFT, and a seventeenth TFT, wherein a source electrode and a gate electrode of the fourteenth TFT are electrically connected with a first high level supplied from a high voltage source, and a drain electrode of the fourteenth TFT is electrically connected with a gate electrode of the fifteenth TFT, a source electrode of the sixteenth TFT, and a source electrode of the seventeenth TFT respectively; a source electrode of the fifteenth TFT is electrically connected with the first node, a drain electrode of the fifteenth TFT is connected with a first low level supplied from a low voltage source; a gate electrode of the sixteenth TFT is electrically connected with the first clock signal, a drain electrode of the sixteenth TFT is electrically connected with the first low level supplied from the low voltage source; a gate electrode of the seventeenth TFT is electrically connected with the second clock signal, and a drain electrode of the seventeenth TFT is electrically connected with the first low level supplied from the low voltage source.

7. The GOA driving circuit according to claim 1, wherein the pull-up unit comprises a third TFT, wherein a source electrode of the third TFT is connected with a first clock signal of the clock signals, a gate electrode of the third TFT is electrically connected with the first node, and a drain electrode of the third TFT is electrically connected with the Nth-stage horizontal scanning line.

8. The GOA driving circuit according to claim 1, wherein the pull-down unit comprises a fourth TFT and a fifth TFT, wherein a source electrode of the fourth TFT is electrically connected with the first node, and a drain electrode of the fourth TFT is connected with a first low level supplied from a low voltage source; a source electrode of the fifth TFT is electrically connected with the Nth-stage horizontal scanning line, a drain electrode of the fifth TFT is connected with the first low level supplied from the low voltage source; a gate electrode of the fourth TFT and a gate electrode of the fifth TFT are both connected with a (N+1)-stage download signal.

9. A liquid crystal display (LCD) device, which comprises a gate driver on array (GOA) driving circuit, wherein the GOA driving circuit comprises a plurality of cascaded GOA units and outputs a gate driving signal to an Nth-stage horizontal scanning line of a display region by an Nth-stage GOA unit, the Nth-stage GOA unit comprises a pull-up unit, a pull-up control unit, a pull-down unit, a pull-down sustaining unit, a download unit, and a bootstrap capacitor unit; the pull-up unit, the pull-down unit, the pull-down sustaining unit, and the bootstrap capacitor unit are respectively electrically connected with a first node and an Nth-stage horizontal scanning line, the pull-up control unit and the download unit are electrically connected with the first node, where N is a positive integer; the Nth-stage GOA unit further comprises:
a forced pull-down unit for forcing the first node to change from a first-node high level to a first-node low level when clock signals disappear;
wherein one cycle of the GOA driving circuit comprises a blanking interval and the clock signals each exhibit multiple successive pulses except the blanking interval of the cycle, wherein each of the multiple pulses of each of the clock signals occupies a period of time in which a voltage level is normally raised from a clock low level to a clock high level, and the clock signals disappear when the clock signals abnormally maintain at the low clock level in the period of time of at least one of the pulses, and the forced pull-down unit forces the first node to the first-node low level when the clock signals disappear except the blanking interval of the cycle.

10. The LCD device according to claim 9, wherein the forced pull-down unit comprises a twelfth thin film transistor (TFT), wherein a gate electrode of the twelfth TFT is connected with a reset signal, a source electrode of the twelfth TFT is electrically connected with the first node, a drain electrode of the twelfth TFT is connected with a first low level, the reset signal changes from a reset low level to a reset high level when the clock signals disappear.

11. The LCD device according to claim 9, wherein the pull-down sustaining unit comprises a sixth TFT, a seventh TFT, an eighth TFT, a ninth TFT, a tenth TFT, and an eleventh TFT, wherein a source electrode of the sixth TFT is connected with the first node, a drain electrode of the sixth TFT is connected with a first low level supplied from a low voltage source, and a gate electrode of the sixth TFT is electrically connected with an Nth-stage second node; a source electrode of the seventh TFT is electrically connected with the Nth-stage horizontal scanning line, a drain electrode of the seventh TFT is connected with the first low level, and a gate electrode of the seventh TFT is electrically connected with the Nth-stage second node; a gate electrode and a source electrode of the eighth TFT are electrically connected with a first high level supplied from a high voltage source, and a drain electrode of the eighth TFT is electrically connected with a gate electrode of the ninth TFT and a source electrode of the eleventh TFT; a source electrode of the ninth TFT is electrically connected with the first high level supplied from the high voltage source, and a drain electrode of the ninth TFT is electrically connected with the Nth-stage second node; a source electrode of the tenth TFT is electrically connected with the Nth-stage second node, a drain electrode of the ten TFT is connected with the first low level supplied from the low voltage source, and a gate electrode of the tenth TFT is electrically connected with the first node; a drain electrode of the eleventh TFT is electrically connected with the first low level supplied from the low voltage source, and a gate electrode of the eleventh TFT is electrically connected with the first node.

12. The LCD device according to claim 11, wherein the forced pull-down unit comprises a thirteenth TFT, a gate electrode of the thirteenth TFT is connected with a reset signal, a source electrode of the thirteenth TFT is electrically connected with the first high level supplied from the high voltage source, a drain electrode of the thirteenth TFT is electrically connected with an Nth-stage second node, the reset signal changes from a reset low level to a reset high level when the clock signals disappear.

13. The LCD device according to claim 11, wherein the clock signals comprise a first clock signal and a second clock signal, wherein the first clock signal and the second clock signal have a same frequency, and in one cycle, phases of the first clock signal and the second clock signal except the blanking interval are opposite in phase; the forced pull-down unit comprises an eighteenth TFT, a nineteenth TFT, a twentieth TFT, and a twenty-first TFT, wherein a source electrode and a gate electrode of the eighteenth TFT are electrically connected with the first high level supplied from the high voltage source, a drain electrode of the eighteenth TFT is electrically connected with a gate electrode of the nineteenth TFT, and a source electrode of the twentieth TFT, and a source electrode of the twenty-first TFT respectively; a source electrode of the nineteenth TFT is electrically connected with the first high level supplied from the high voltage source, and a drain electrode of the nineteenth TFT is connected with the Nth-stage second node; a gate electrode of the twentieth TFT is electrically connected with the first clock signal, a drain electrode of the twentieth TFT is electrically connected with the first low level supplied from the low voltage source; a gate electrode of the twenty-first TFT is electrically connected with the second clock signal, and a drain electrode of the twenty-first TFT is electrically connected with the first low level supplied from the low voltage source.

14. The LCD device according to claim 9, wherein the clock signals comprise a first clock signal and a second clock signal, the first clock signal and the second clock signal have a same frequency, and in one cycle, phases of the first clock signal and the second clock signal except the blanking interval are opposite in phase; the forced pull-down unit comprises an fourteenth TFT, a fifteenth TFT, a sixteenth TFT, and a seventeenth TFT, wherein a source electrode and a gate electrode of the fourteenth TFT are electrically connected with a first high level supplied from a high voltage source, and a drain electrode of the fourteenth TFT is electrically connected with a gate electrode of the fifteenth TFT, a source electrode of the sixteenth TFT, and a source electrode of the seventeenth TFT respectively; a source electrode of the fifteenth TFT is electrically connected with the first node, a drain electrode of the fifteenth TFT is connected with a first low level supplied from a low voltage source; a gate electrode of the sixteenth TFT is electrically connected with the first clock signal, a drain electrode of the sixteenth TFT is electrically connected with the first low level supplied from the low voltage source; a gate electrode of the seventeenth TFT is electrically connected with the second clock signal, and a drain electrode of the seventeenth TFT is electrically connected with the first low level supplied from the low voltage source.

* * * * *